United States Patent [19]

Shewchun et al.

[11] 3,949,119
[45] Apr. 6, 1976

[54] METHOD OF GAS DOPING OF VACUUM EVAPORATED EPITAXIAL SILICON FILMS

[75] Inventors: John Shewchun, Burlington; Fredrick David King, Hamilton, both of Canada

[73] Assignee: Atomic Energy of Canada Limited, Canada

[22] Filed: Oct. 18, 1974

[21] Appl. No.: 515,853

Related U.S. Application Data

[63] Continuation of Ser. No. 276,926, Aug. 1, 1972, abandoned.

[30] Foreign Application Priority Data

May 4, 1972   Canada................................ 141298

[52] U.S. Cl. .................. 427/85; 148/174; 148/175; 148/189; 204/192; 427/86
[51] Int. Cl.² ............... H01L 21/203; H01L 21/205
[58] Field of Search.................... 148/174, 175, 189; 117/106 A, 201; 204/192

[56] References Cited

UNITED STATES PATENTS

| | | | |
|---|---|---|---|
| 2,834,697 | 5/1958 | Smits .................................. | 148/189 |
| 3,524,776 | 8/1970 | Hampikian et al. ............ | 117/106 A |
| 3,660,062 | 5/1972 | Keller........................... | 148/171 UX |

OTHER PUBLICATIONS

Weisberg, L. R., "Low–Temperature Vacuum Deposition —Silicon" J. Appl. Phys., Vol. 38, 1967, pp. 4537–4538.
Itoh et al., "Electrical Properties—Silicon on Sapphire—Evaporation" J. Appl. Phys, Vol. 39, No. 11, Oct. 1968, pp. 5310–5313.
Haq, K. E., "Deposition of Germanium Films by Sputtering" J. Electrochem. Soc., Vol. 112, No. 5, May 1965, pp. 500–502.
Booker et al., "Growth of Epitaxial Layers by Vacuum Evaporation" Phil. Mag., Ser. 8, Vol. 11, Jan., 1965, pp. 11–30.

*Primary Examiner*—L. Dewayne Rutledge
*Assistant Examiner*—W. G. Saba
*Attorney, Agent, or Firm*—Stevens, Davis, Miller & Mosher

[57] ABSTRACT

A new technique for the controlled incorporation of doping impurities into homoepitaxial silicon films by gas bombardment with arsine and diborane has been investigated. Hall effect and conductivity measurements have been used to show that P and N-type silicon thin films, having mobility values close to those of bulk material may be evaporated at 700°C onto silicon <111> substrates. The substrates are precleaned by evaporating 50A of silicon at 775°C. Step etch measurements have shown that the gas doped films possess uniform impurity concentrations. Diode structures formed by evaporating P and N-type layers onto substrates of the opposite doping type have been investigated. These diodes show good rectification properties. Capacitance-voltage measurements confirm the abrupt nature of the evaporated junctions. Minority carrier lifetimes of 2 to 3µ sec. have been measured in the evaporated structures.

4 Claims, 6 Drawing Figures

METHOD OF GAS DOPING OF VACUUM EVAPORATED EPITAXIAL SILICON FILMS

This is a continuation of application Ser. No. 276,926, filed Aug. 1, 1972, now abandoned.

The invention relates to a method of producing doped semi-conductor layers. The invention has particular, but not exclusive, use in the production of energy conversion devices utilising radio isotope sources.

The p-n semiconductor junctions (diodes) used as energy converters with low energy $\beta$ emitters such as Promethium are usually formed by conventional gaseous diffusion processes at as low a temperature as possible. Low temperatures are required in order to preserve minority carrier lifetime, a quantity which determines, in part, the conversion efficiency. Generally, the lowest practical temperature for the diffusion process is approximately 900°C.

In the present invention p-n junctions are formed by epitaxial growth of doped silicon layers on silicon substrate wafers of opposite conductivity type. Growth temperatures from 550°C to 850°C have been employed. The epitaxial growth takes place in a high vacuum evaporator at pressures in the range $10^{-5}$ to $10^{-9}$ mm Hg. A charge of near intrinsic silicon is placed in the crucible of an electron beam gun evaporator and the material is deposited onto a heated silicon wafer. During the evaporation a dopant gas such as diborane, phosphine or arsine is injected into the vacuum system. When the dopant gas strikes the heated silicon surface, it decomposes, liberating the corresponding dopant (boron, phosphorus, arsenic) which is incorporated into the growing epitaxial layer. Junctions having characteristics comparable to those fabricated by diffusion have been produced.

Although epitaxial growth in vacuum systems has been demonstrated previously and reported in the literature, the present invention is the first successful doping system where both p-type and n-type layers can be grown using the same evaporation source. Furthermore, by controlling the partial pressure of the injected dopant gas, the concentration of the dopant can be controlled over a wide range (intrinsic to $5 \times 10^{19}$ atoms/cc.). The present process has several distinct facets which can be used to create more efficient direct energy converters. First of all, the low growth temperatures (500°C – 850°C) allow the carrier lifetime of the substrate wafer to be preserved with little degradation. Secondly, the gas doping approach allows different impurity profiles to be introduced which could lead to more optimum junction than can be formed by diffusion. Finally, the epitaxial growth process allows for the possibility of incorporating radioisotopes directly into the silicon and therefore increasing efficiency.

Analysis of the modified diode equation, $$I = I_s (e^{\beta V} - 1) - I_L$$

where
$I_s$ = P-N junction reverse saturation current
$I_L$ = generation current due to the $\beta$ particle radioisotope flux
$\beta = q/\lambda KT$
which is used to model the operation of semiconductor P-N junctions in energy conversion applications yields the following expressions at maximum power (mp) conditions:

$$(1 + \beta V_{mp}) \exp(\beta V_{mp}) = (1 + (I_L)/I_s)$$

$$I_{mp} = I_s \beta V_{mp} \exp(\beta V_{mp})$$

$$P_{max} = I_s \beta V_{mp}^2 \exp(\beta V_{mp})$$

These expressions indicate that, to increase power output $V_{mp}$ should be as large as possible. A large $V_{mp}$ means, in turn, that the ratio $I_L/I_s$ should be as large as possible. In practice, the need for low values of $I_s$ and high values of $I_L$ are conflicting. In a typical P-N junction the reverse saturation current is predominantly due to recombination-generation in the depletion region. This region should thus be as narrow as possible. A narrow depletion width requires a junction which is abrupt with a relatively high doping concentration in both the P and N regions. The concentrations of such impurities as gold and iron which give rise to recombination-generation centres in the depletion region should be kept to a miniumum.

High values of $I_L$, however, require a large active region for the P-N junction from which minority carriers generated by Beta particles may be collected. The active region is approximately equal to the sum of the minority carrier diffusion lengths on either side of the junction. For large diffusion lengths the doping concentrations should be low, in conflict with the previously stated requirement for $I_s$.

An additional constraint lies in matching the Beta emission spectrum of the isotope source to the active region of the junction to ensure maximum pair creation in regions from which collection may take place. To provide a suitable source of Beta particles, a layer of Promethium several microns thick is usually placed on top of a silicon wafer containing a diffused junction. Typically 90% of the incoming $\beta$ particles will loose all their energy in creating electron-hole pairs in a region of silicon semiconductor 64 microns deep. The problem is one of building a P-N junction with an active region of approximately this length. The conventional solution employed uses low temperature diffusion to create a heavily doped layer of N type material some 0.2 microns deep in a P type substrate of resistivity around 10 ohm-cm. The effective active region of the device is thus approximately equal to the electron diffusion length in the P type substrate. Normally, there is a deterioration in minority carrier lifetime in both the diffused and undiffused regions during the diffusion. The deterioration in the former is sufficiently great to effectively create a dead region close to the surface of the device from which no minority carriers can be collected. The low energy end of the Beta emission spectrum is thus rendered ineffective for energy conversion.

The chief losses in a structure fabricated in this way are;
1. minority carriers created in the dead region which recombine before reaching the junction.
2. minority carriers recombining in the active region. The number of these will depend on the substrate lifetime after diffusion and on the geometry of the system. Generally low temperature diffusion will have a less severe effect on lifetimes.
3. minority carriers created by high energy Beta particles after passing through the active region ($\beta$ energy spectrum loss).

Progressive radiation damage in the device will produce a further decrease in the minority lifetimes and diffusion lengths by causing an increase in the concentration of trapping centres due to defects. It has been found that p-type semiconductor material is less susceptible to radiation damage and thus junctions fabricated by an $n^+$ diffusion into p-type semiconductor yield a more stable output.

A conventional diffusion will, in addition, produce somewhat graded junctions whose depletion region widths are greater for the same voltage than would be those of so called hyper abrupt junctions. The reverse saturation currents will thus be correspondingly higher. In an attempt to overcome some of the limitations of conventional diffusion techniques, a technique has been explored which forms P-N junctions by epitaxial growth. There exist several possible advantages in this type of junction fabrication:

1. The temperatures involved are some 100°C to 300°C lower than those used in diffusion. The minority carrier lifetime in the substrate should thus be better preserved resulting in larger active regions and hence larger generation currents, $I_L$.
2. The grown junctions should be hyper-abrupt with consequent narrow depletion regions and low reverse saturation currents.
3. The possibility of preserving minority carrier lifetime in the epitaxial layer and thus creating junctions whose active region would be appreciable in both the P and N sides.

In addition, by placing the junction further from the surface more efficient collection of minority carriers from high energy Beta particles might be effected. There would exist no dead region as is the case for diffused junctions. In order to achieve the full potential advantages of grown diodes, the deposited layer must be sufficiently defect and impurity free to permit long lifetimes with a low concentration of trapping centres at the interface.

When a $\beta$-emitting source is used in external contact with a P-N junction to form an energy conversion cell, there is usually a practical upper limit to the flux that can be supplied to the junction due primarily to self-absorption in the isotope layer. This implies an upper limit to $I_L$ for any given isotope. One approach that can be considered to increase $I_L$ is the incorporation of isotope material integrally in the semiconductor making up the P-N junction. Large concentrations ($10^{20}$ or $10^{21}$ atoms/cc) are likely to be required and there exists the possibility of lifetime degradation due to the large concentrations. The expitaxial methods of junction growth lend themselves naturally to the incorporation of isotopes into the semiconductor.

Conventional diffusion techniques are usually carried out by placing a wafer in a gaseous stream, at essentially atmospheric pressure, containing the impurity dopant. Any unwanted trace impurities such as gold which may be left on the surface of the silicon when it is cleaned, for example, also diffuse into the junction. These act as (1) lifetime killing traps which reduce the active regions for $\beta$ energy conversion and (2) recombination-generation centres in the depletion region which increase reverse saturation current.

The present invention provides a technique for fabricating P-N junctions for use in $\beta$-voltaic energy cells wherein epitaxial growth is employed. The objective with the epitaxial method is three-fold: the production of abrupt junctions with low reverse saturation currents, the increase in $I_L$ due to an increase in the active region through much improved lifetime regions on either side of the junction and the determination of whether isotopes can be incorporated into the bulk of the P-N junction during growth so as to increase the available $I_L$.

It is well known that the homoepitaxial growth of silicon thin films vacuum deposited by evaporation or sublimitation may take place at temperatures as low as 400°C for the <100> orientation and 650°C for the <111> orientation. Reference is made to 1. L. R. Weisberg, J. Appl. Phys., Vol. 38, P. 4537, 1967.
2. R. N. Thomas, M. H. Francombe, Applied Physics Letters, Vol. 11, No. 3, August, 1967.

The potential advantages of this low temperature epitaxy have not, however, been utilized due to the difficulty in uniformly doping the films during deposition. A new method has been devised where doping of electron beam evaporated epitaxial silicon films is achieved by leaking a suitable doping gas into the vacuum system during the deposition. Reference is made to 3. E. T. Handelman, E. I. Povilonis, J. Electrochem. Soc., 11, No. 2, February, 1964.
4. T. Itoh, S. Hasegawa, N. Kaminaka, J. Appl. Phys., Vol. 40, No. 6, May, 1969.

Previous workers have given a range of pressures and substrate temperatures within which homoepitaxial growth of silicon films, whose semiconductor properties are comparable with those of bulk silicon, may be achieved. Reference is again made to the above-mentioned to the Weisberg and Thomas article mentioned above.

The present invention will now be described with reference to the accompanying drawings in which:

FIG. 6 are plots for Reverse Bias P on N Diode wherein:

Curve A is Capacitance versus Voltage Curve B is $1/C^2$ versus Voltage.

Figure 1:
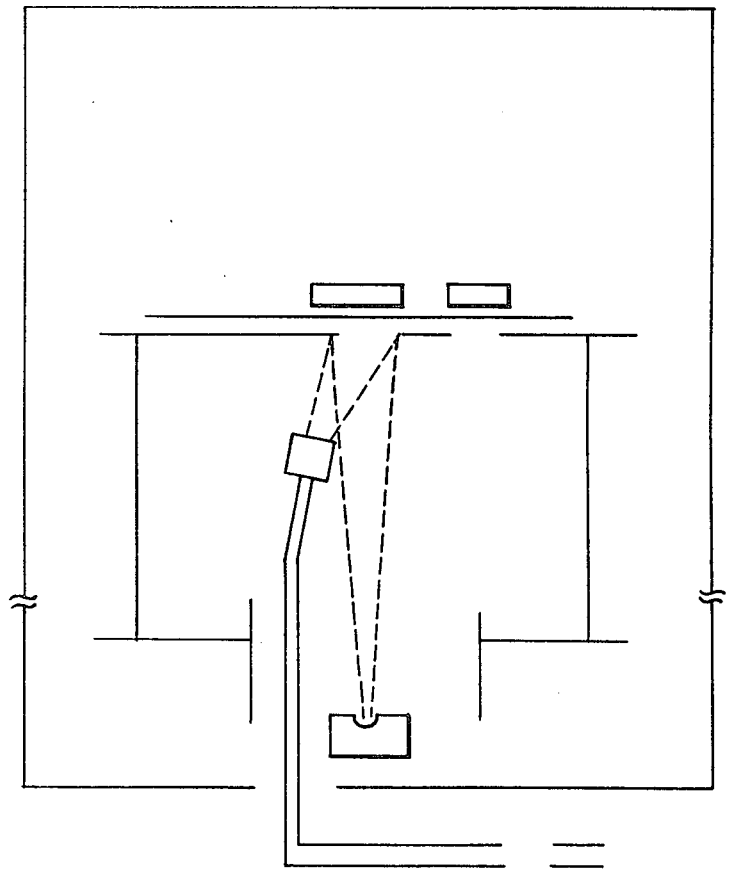
FIG. 1 is a diagram of an Evaporation and Doping System.

Referring now to the drawings, the vacuum system consisted of a commercial Ultra High Vacuum stainless steel ion- and cyro-pumped bell jar with a potential base pressure of $4 \times 10^{-11}$ Torr. An abreviated schematic diagram is shown in FIG. 1.

The silicon evaporation charges were cut from a single crystal of 100 ohm-cm resistivity, P type and oxygen content less than $2 \times 10^{16}$ atoms cm$^{-3}$. This low oxygen silicon source is known (see Weisberg, referred to above) to considerably extend the pressure and temperature range within which epitaxy may be achieved. After mechanical cleaning and degreasing, the charges were heavily etched, rinsed in deionized water and placed in the crucible. Evaporation was by electron bombardment from a conventional magnetically focussed electron gun with beam currents from 100 to 300 ma at 4 kv. Evaporation rates were in the range 3 to 10 A per second with a source to substrate distance of 10 inches. Film thickness and evaporation rates were monitored using a quartz crystal oscillator. In addition, direct measurements were made using multiple beam interferometry.

The substrates used were silicon <111> wafers obtained in a polished state from commercial suppliers. These were immersed in 48% HF for 30 seconds, blown dry and placed in the system. Substrate heating was by electron bombardment of a tantalum sheet on which the substrates were placed. The substrate temperature range used for depositions was 550°–850°C. Temperatures were monitored using a Pt./Pt.-Rd. Thermocouple fastened to the tantalum sheet and checked at high temperatures with a pyrometer. A feedback system controlled the substrate temperature to an overall accuracy of some 2%.

Arsine, $AsH_3$, Diborane, $B_2H_6$ and phosphine, $PH_3$, were chosen for doping gases since these decompose into elemental states at or below temperatures that formed the deposition range (550°C – 850°C) for the substrate. At temperatures higher than 750°C the evaporated silicon tends to etch the substrate surface leading to a deterioration in semiconductor properties. The Arsine and Diborane used were in a concentration of 1% diluted with high purity hydrogen, the phosphine was nominally 100%. The doping gases were passed into the system through ultra high vacuum leak valves.

In a typical evaporation, the system was first pumped to a pressure of $10^{-0.10}$ torr and the substrate temperature raised to 800°C for 5 minutes for outgassing. The pressure increased to approximately $8 \times 10^{-9}$ torr during the preheat. The substrate was then lowered to the evaporation temperature and covered with a shutter while evaporation was initiated and brought to the desired rate. The required partial pressure of doping gas in the system was attained by opening the leak valve. Finally the shutter was removed and the thin film evaporated. Total pressures in the system as high as a $5 \times 10^{-6}$ torr were reached for the highest doping levels.

The evaporated silicon films were shown to be physically of good quality by electron diffraction examinations which yielded reflection patterns having the characteristic <111> Kikuchi lines with no visable defect structure. A better indication of the quality of semiconductor material achieved was obtained by the high values of majority carrier mobility recorded in Hall effect measurements. These will be presented below.

Doping concentrations were evaluated by both M.O.S. and conductivity measurements for a series of Boron and Arsine doped layers deposited on <111> substrates.

In the former technique, the ratio of maximum to minimum high frequency capacitance is measured for an M.O.S. capacitor formed on the evaporated layer by growing 300A of thermal oxide and evaporating aluminum dots to form the M.O.S. structure. Redistribution in the substrate and layer was assumed to be minimal for the relatively short times and low temperatures used during the oxide growth.

Conductivity measurements were made using the Van Der Pauw geometry. N and P type layers were evaporated on substrates of the opposite doping type and the required geometry masked with thick aluminum prior to mesa etching. The evaporated layers were isolated from the substrate during the measurement by applying a reverse bias. The reverse leakage current in the mesa structure was less than 5% of the conductivity current.

Figure 2:
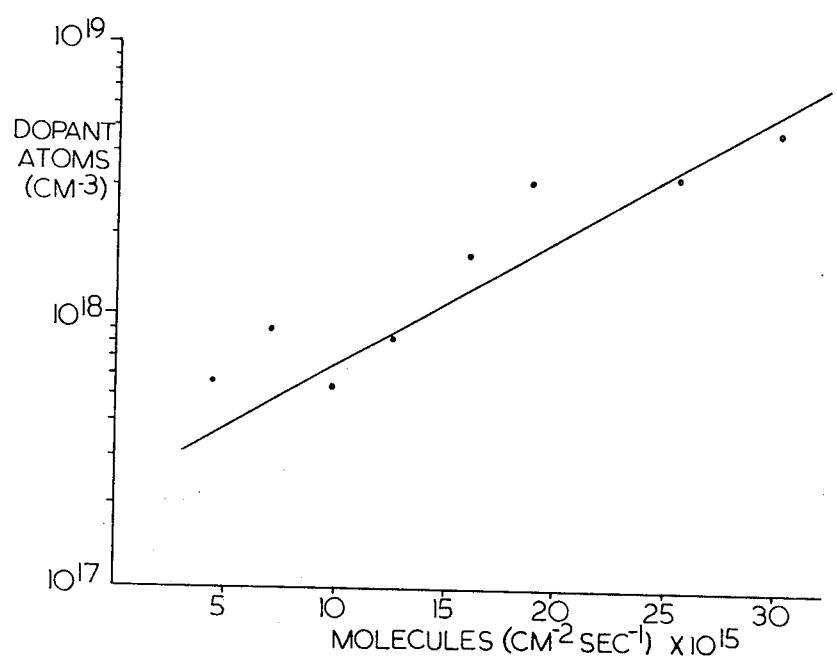
FIG. 2 is a plot of doping concentration in P Type evaporated layers against the rate of incidence of doping gas molecules during the evaporation.

FIG. 2 illustrates a plot of doping concentration (as determined by the M.O.S. technique) versus relative gas doping level for a series of Boron doped layers on 6–9 ohm-cm N type substrates.

Figure 3:
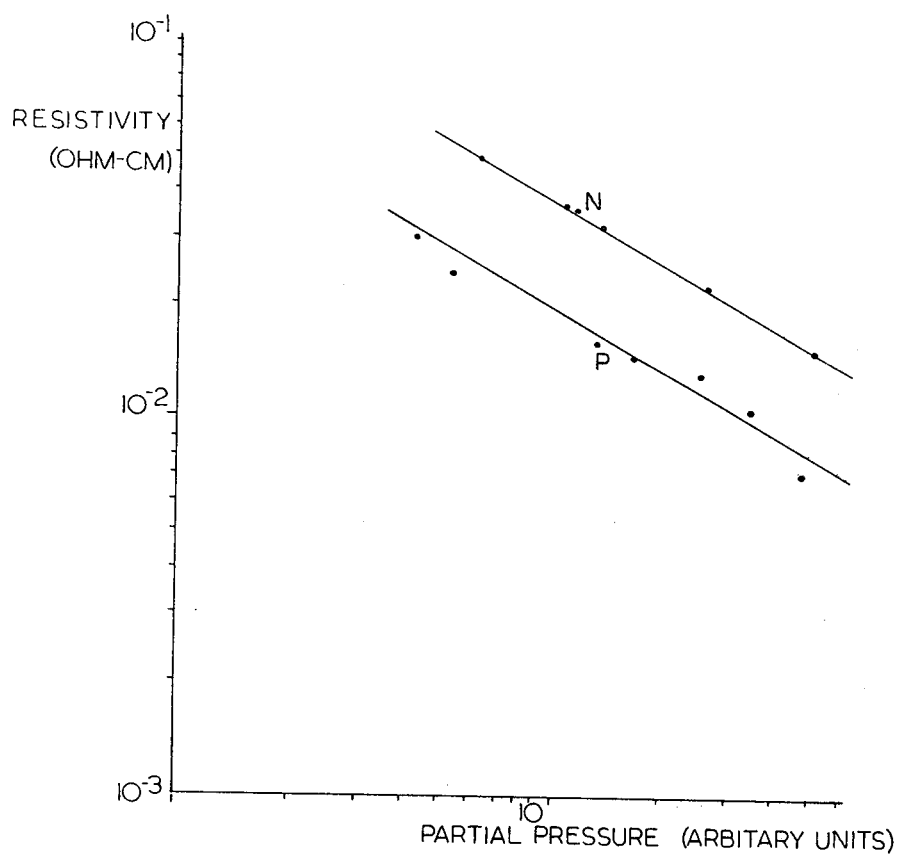
FIG. 3 is a plot of resistivity in evaporated N and P type layers against partial pressure of doping gas during evaporation.

FIG. 3 illustrates plots of resistivity in ohm-cm versus doping gas pressure for (a) Boron doped layers approximately .2 microns thick on <111> 6–9 ohm-cm Phosphorus doped substrates and (b) Arsine doped layers of the same thickness on <111> 10–20 ohm-cm$^{-1}$ Boron doped substrates. The values of doping gas pressures were corrected to allow for different evaporation rates. At equilibrium pressure, the number of molecules leaked into the system per second is equal to the pumping speed. For ion pumps this speed is approximately linearly dependent of pressure. If a constant proportion of the doping gas molecules are incorporated into the lattice of the film being deposited, the impurity concentration of the evaporated layers should depend linearly in the partial pressure of the doping gas in the system.

From the two cases illustrated, it was estimated that 0.002% of the Diborane and 0.0002% of the Arsine molecules decomposed at the respective substrate temperatures, 675°C for Diborane and 700°C for Arsine. Experiments using Phosphine indicated that doping concentrations in excess of $5 \times 10^{19}$ atoms $CM^{-3}$ could be obtained at temperatures as low as 550°C.

Hall mobilities were determined in the evaporated films using Van Der Pauw Clover Leaf geometry. The values measured tended to be lower than generally associated with bulk silicon single crystal material. This is probably the result of either defects in the layers or two dimensional quantum mechanical effects when the surface of the thin films are close together.

Table (1) illustrates the Hall mobility values for several N and P layers of different doping concentration. The corresponding values of film conductivity mobility for the layers are obtained by applying correction factors[7].

TABLE (1)

| Sample | Resistivity (ohm-cm) | Hall Mobility (cm$^2$/volt-sec) | Film Conductivity Mobility (cm$^2$/volt-sec) | Typical Bulk Silicon Conductivity Mobility (cm$^2$/volt-sec) |
|---|---|---|---|---|
| $P_{11}$ | $2.36 \times 10^{-2}$ | 102 | 140 | 160 |
| $P_{13}$ | $1.45 \times 10^{-2}$ | 80 | 111 | 120 |
| $N_{29}$ | $7.8 \times 10^{-3}$ | 135 | 115 | 130 |
| $N_{40}$ | $3.7 \times 10^{-2}$ | 423 | 360 | 400 |

Figure 4:
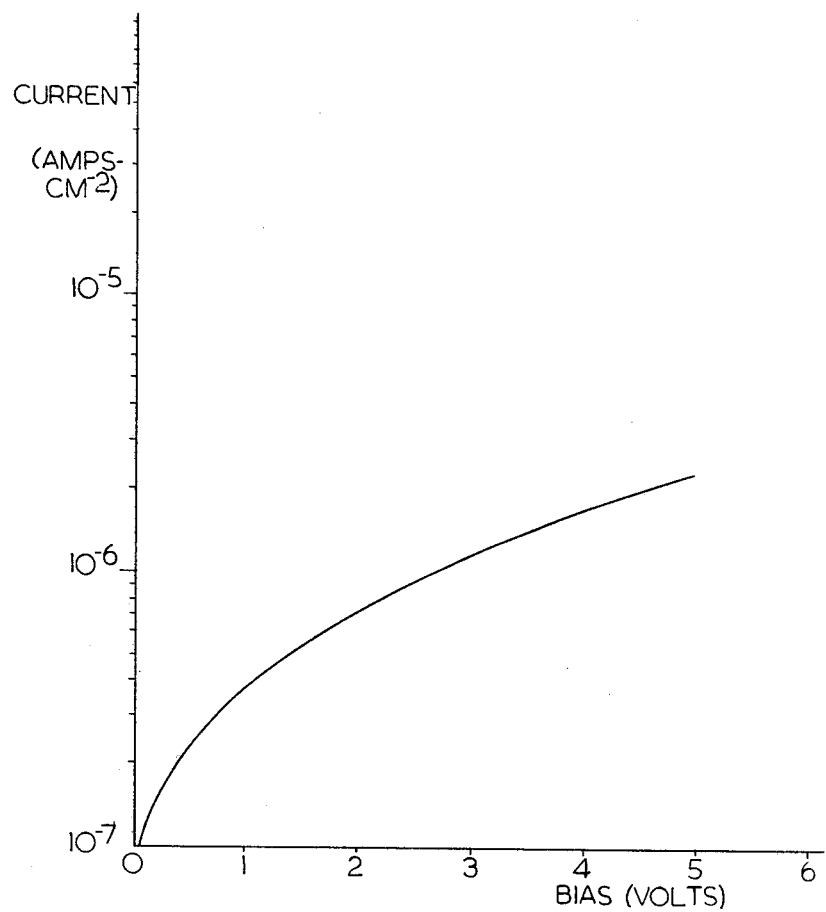
FIG. 4 is a plot of Diode Reverse Current for an evaporated N Type Layer of Doping Density $3 \times 10^{17}$ Atoms/cm$^3$ on 100 ohm-cm P Type Substrate.
Figure 5:
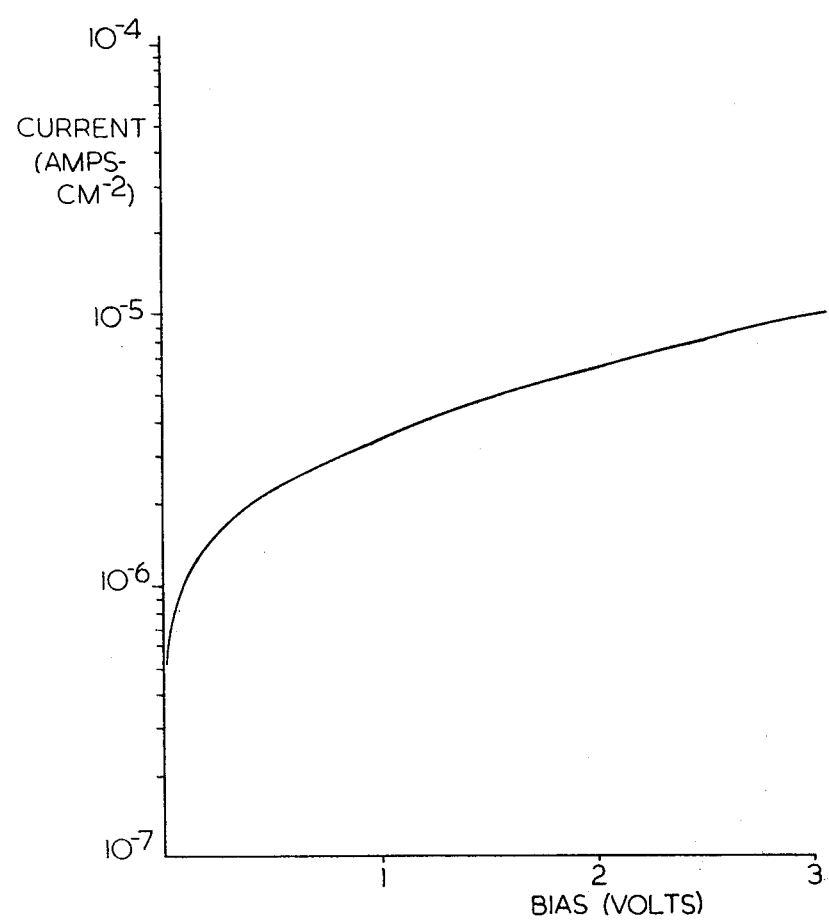
FIG. 5 is a plot of Diode Reverse Current for an Evaporated P Type Layer of Doping Density $2 \times 10^{18}$ Atoms/cm$^3$ on 6–9 ohm-cm N Type Substrate.

FIGS. 4 and 5 illustrate log current versus voltage plots for diodes in reverse bias formed from evaporated layers. In cases where no heating of scrubbing treatment was applied to the substrate, typical reverse currents recorded at 1 volt were $5 \times 10^{-6}$ amps cm$^{-2}$ for P type layers on 6–9 ohm cm N type substrates and $5 \times 10^{-7}$ amps cm$^{-2}$ for N layers on 10–20 ohm cm P type substrates.

Some preliminary investigations were made to determined the effect of heating and scrubbing treatments on the reverse bias current characteristics of the epitaxially grown PN junctions. The results are summarized below:

| Diode | Treatment | Reverse Current at 1 Volt | Characteristics |
|---|---|---|---|
| $N_9$ | Pre-evaporate 50 A° of silicon at 850°C prior to main evaporation | $8 \times 10^{-7}$ amps-cm$^{-2}$ | sample showed typical diode reverse characteristic with saturation current of $4 \times 10^{-6}$ amps |
| $N_5$ | Preheat sample for 1 min. at 900°C | $< 10^{-7}$ amps-cm$^2$ | Current rose very rapidly for voltage $>1.5$ volts |
| $N_7$ | Post heat sample for 2 mins. at 900°C | $4 \times 10^{-6}$ amps-cm$^2$ | Typical high current reverse characteristic |

There is a preliminary indication that substrate scrubbing by preevaporation of a small silicon layer at temperatures somewhat in excess of the deposition temperature can significantly improve device characteristics.

Figure 6:
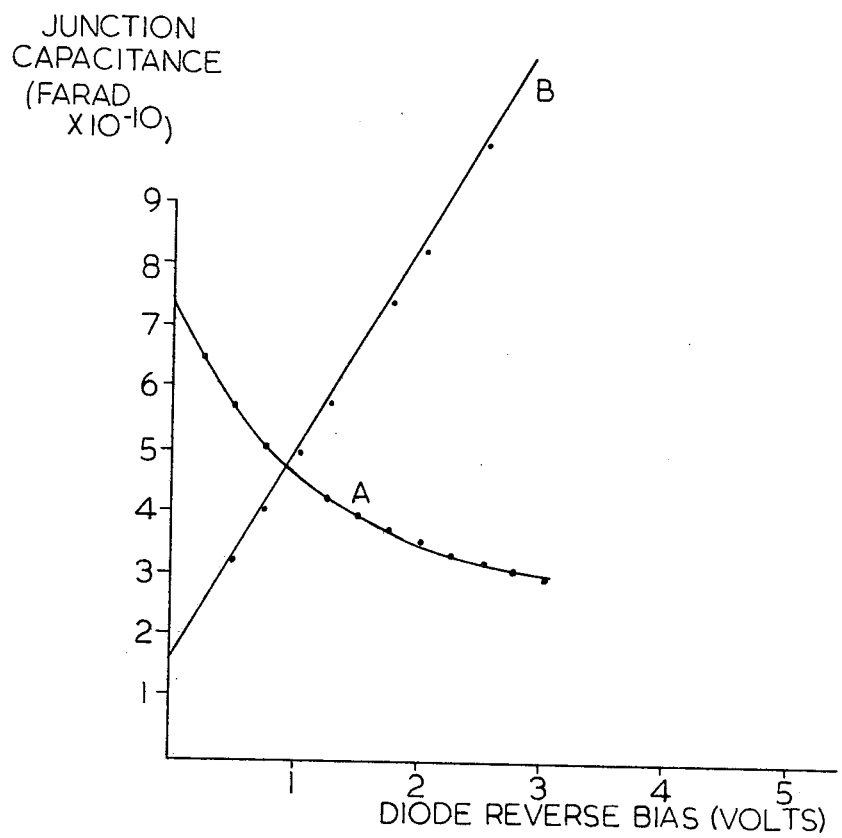

The capacitance-voltage characteristics for a number of mesa diodes were measured in reverse bias. A typical curve is shown in FIG. 6. For a hyper-abrupt junction with one side heavily doped, the capacitance-voltage behaviour should be $$\frac{1}{C^2} = \frac{2}{q \, \epsilon_s \, N_B}(V_D \pm V)$$

where $\epsilon_s$ is the dielectric constant for silicon, $N_B$ is the impurity concentration for the lightly doped side of the junction and $V_D$ is the diffusion potential. The capacitance-voltage was replotted as $1/C^2$ versus V and the results are shown also in FIG. 6 confirming that the junctions grown were probably abrupt. The straight line indicates an abrupt junction with substrate resistivity 15 ohm-cm and diffusion potential 0.65 volts.

In all cases, the predicted doping density of the substrate from plots of $1/C^2$ versus V were in good agreement with values determined from four point probe measurements. The junction diffusion voltages, $V_D$, determined from an extrapolation of the $1/C^2$ curves agreed well with those expected from the known doping densities on either side of the junction.

Preliminary measurements were made to determine the doping profiles of the grown layers using successive chemical etching of thin layers with sheet resistivity measurements. Within experimental limits the layers were found to be uniformly doped.

It has been established that gas doping of vacuum evaporated silicon offers a method for producing semiconductor layers with a high degree of reproducibility in terms of dopant impurity levels and distribution profiles. The temperatures required are appreciably lower than those for conventional chemical vapour growth, thus minimizing auto doping. The decomposition rates of Arsine, Phosphine and Diborane at epitaxial temperatures (550° –850°C) are sufficient to provide high doping concentrations. The range of pressures at which epitaxy may be achieved is sufficiently flexible to permit films of almost any doping profile to be deposited. The evaporated films show a high degree of uniformity and crystalline perfection, as evidenced by their large majority carrier mobilities.

Although the reverse saturation currents obtained with the vacuum epitaxial diodes are reasonably good, they are approximately an order of magnitude higher than that obtained with junctions fabricated by conventional gaseous diffusion. This may be due to the following:

1. Although a relatively small proportion of the depletion region lies in the evaporated layer, this forms the heavily doped side of the junction and a high concentration of recombination-generation centers in the deposited silicon would give a contribution to the reverse saturation current.
2. Defects and impurities at the physical interface could give rise to a numer of recombination-generation centers. These would be in the depletion region and thus could give rise to appreciable recombination currents.

Applications of Vacuum Gas Doping of Deposited Epitaxial Silicon Films

1. High Power Diodes and Transistors

Abrupt profiles and long lifetimes are required.

2. Photodiodes

Silicon photodiode arrays using shallow junctions have application in TV cameras, image intensifiers, etc.

3. Integrated Circuits

Capability of forming arrays of both active (bi-polar transistors, FET's etc.) and passive (resistors) elements directly in a multiple deposition process at temperatures at least 200°C lower than those used in existing diffusion techniques.

4. Hyperabrupt Junction Devices

IMPATT diodes and varactors with improved characteristics could be fabricated.

5. Devices on Insulating Substrates

In conventional integrated circuits the various components interact through the substrate. This could be eliminated by depositing silicon on an insulator such as $Al_2O_3$ and removing the unwanted material which couples to neighbouring devices by chemical etching.

6. Heterojunction Devices silicon can be evaporated unto substrates other than silicon to create heterojunctions.

This evaporation gas doping technique would permit structures to be fabricated which could not be made by any other presently known technique in that 1. the temperatures involved (500° to 850°C) are lower than those employed in (a) diffusion, (b) chemical epitaxy so minimizing unwanted diffusion and allowing sharp changes in impurity concentration to be obtained.

2. profile is not limited by (a) diffusion properties, (b) single or multiple ion implantation absorption profiles, and, 3. non contacting masking techniques may be employed.

Other embodiments of the invention falling within the terms of the appended claims will occur to those skilled in the art.

We claim:

1. A method of forming a semi-conductor junction comprising the steps of:
   i. cleaning a polished silicon substrate,
   ii. cleaning a silicon evaporation charge,
   iii. disposing said substrate and said charge in a high vacuum of $10^{-5}$ to $10^{-9}$ mm Hg,
   iv. heating said substrate to a deposition temperature in the range of 550° to 850°C.,
   v. evaporating said charge onto the surface of said substrate at rates of 3 to 10 angstroms per second to deposit a film thereon, and
   vi. directing a decomposable doping gas into said high vacuum onto the substrate surface during the evaporation of said charge thereby causing a partial pressure rise in the overall vacuum, a chemical reaction occurring in which the doping gas decomposes releasing the dopant which is incorporated into said film.

2. The method of claim 1 wherein said doping gas is selected from Arsine, Diborane, and Phosphine.

3. The method of claim 1 wherein said evaporation charge consists of near intrinsic silicon having a low oxygen content.

4. The method of claim 1 wherein said step (ii) is effected by exposing said substrate to evaporated silicon at a substrate temperature sufficient to permit etching of any oxide layer on the substrate for the purpose of providing a cleaner surface for growth to be effected.

* * * * *